(12) United States Patent
Loeppert et al.

(10) Patent No.: US 11,827,511 B2
(45) Date of Patent: Nov. 28, 2023

(54) FORCE FEEDBACK COMPENSATED ABSOLUTE PRESSURE SENSOR

(71) Applicant: Knowles Electronics, LLC, Itasca, IL (US)

(72) Inventors: Peter V. Loeppert, Durand, IL (US); Michael Pedersen, Long Grove, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 416 days.

(21) Appl. No.: 17/286,231

(22) PCT Filed: Nov. 18, 2019

(86) PCT No.: PCT/US2019/062046
§ 371 (c)(1),
(2) Date: Apr. 16, 2021

(87) PCT Pub. No.: WO2020/106637
PCT Pub. Date: May 28, 2020

(65) Prior Publication Data
US 2021/0340006 A1 Nov. 4, 2021

Related U.S. Application Data

(60) Provisional application No. 62/769,468, filed on Nov. 19, 2018.

(51) Int. Cl.
*H04R 3/00* (2006.01)
*B81B 3/00* (2006.01)
*H04R 1/32* (2006.01)

(52) U.S. Cl.
CPC ............. *B81B 3/0059* (2013.01); *H04R 1/32* (2013.01); *B81B 2201/0257* (2013.01); *B81B 2201/0264* (2013.01)

(58) Field of Classification Search
CPC ................................ B81B 3/0059; H04R 1/32
See application file for complete search history.

(56) References Cited

U.S. PATENT DOCUMENTS 9,131,319 B2    9/2015   Zoellin et al.
9,503,814 B2   11/2016   Schultz et al.
(Continued)

FOREIGN PATENT DOCUMENTS

JP    2008259061 A    10/2008
JP    2011101304 A     5/2011

OTHER PUBLICATIONS

International Search Report, International application No. PCT/US2019/062046, Date of the actual completion of the international search Apr. 2, 2020.
(Continued)

*Primary Examiner* — Simon King
(74) *Attorney, Agent, or Firm* — FLENER IP & BUSINESS LAW; Zareefa B. Flener

(57) ABSTRACT

A MEMS transducer for a microphone includes a closed chamber, an array of conductive pins, a dielectric grid, and a diaphragm. The closed chamber is at a pressure lower than atmospheric pressure. The array of conductive pins is in a fixed position in the closed chamber, distributed in two dimensions, and have gaps formed therebetween. The dielectric grid is positioned within the closed chamber, includes a grid of dielectric material positioned between the gaps of the array of conductive pins, and is configured to move parallel to the conductive pins. The diaphragm is configured to form a portion of the closed chamber and deflect in response to changes in a differential pressure between the pressure within the closed chamber and a pressure outside the transducer. The diaphragm is configured (Continued)

to move the dielectric grid relative to the array of conductive pins in response to a change in the differential pressure.

21 Claims, 11 Drawing Sheets

(56) References Cited

U.S. PATENT DOCUMENTS

| | | | |
|---|---|---|---|
| 9,641,137 | B2 | 5/2017 | Duenser et al. |
| 10,153,740 | B2 | 12/2018 | Albers et al. |
| 10,362,408 | B2 | 7/2019 | Kuntzman et al. |
| 10,405,106 | B2 | 9/2019 | Lee |
| 2010/0164025 | A1 | 7/2010 | Yang |
| 2015/0110291 | A1 | 4/2015 | Furst et al. |
| 2016/0066099 | A1 | 3/2016 | Dehe et al. |
| 2016/0167954 | A1* | 6/2016 | Gogoi .................... H10N 59/00 257/415 |
| 2017/0260040 | A1 | 9/2017 | Walther et al. |
| 2018/0194615 | A1* | 7/2018 | Nawaz ................. B81B 3/0027 |
| 2020/0112799 | A1 | 4/2020 | Kuntzman et al. |
| 2020/0252728 | A1 | 8/2020 | Niederberger |
| 2020/0252729 | A1 | 8/2020 | Mueller et al. |
| 2021/0029470 | A1 | 1/2021 | Nawaz et al. |
| 2021/0120323 | A1 | 4/2021 | Naderyan et al. |
| 2021/0176569 | A1 | 6/2021 | Nawaz et al. |
| 2021/0204048 | A1 | 7/2021 | Chandrasekaran et al. |

OTHER PUBLICATIONS

PCT Written Opinion of the International Searching Authority, PCT/US2019/062046, International Filing date Nov. 18, 2019, dated Apr. 3, 2020.

MEMS Device With Electrodes and a Dielectric, U.S. Appl. No. 17/111,465, filed Dec. 3, 2020, Inventors: Loeppert, Peter and Pedersen, Michael, Applicant: Knowles Electronics, LLC.

Method and Apparatus for Balancing Detection Sensitivity in Producing a Different Signal, U.S. Appl. No. 17/317,832, filed May 11, 2021, Applicant: Knowles Electronics, LLC.

MEMS Device With Electrodes and a Dielectric, U.S. Appl. No. 17/133,506, filed Dec. 23, 2020, Inventors: Loeppert, Peter and Pedersen, Michael, Applicant: Knowles Electronics, LLC.

MEMS Acoustic Sensor and Assembly, U.S. Appl. No. 17/137,678, Filing Date: Dec. 30, 2020, Inventor: Guo, Jim, Applicant: Knowles Electronics, LLC.

* cited by examiner

FORCE FEEDBACK COMPENSATED ABSOLUTE PRESSURE SENSOR

CROSS-REFERENCE TO RELATED PATENT APPLICATION

This application claims the benefit of U.S. Provisional Patent Application No. 62/769,468, filed Nov. 19, 2018, the disclosure of which is incorporated herein by reference in its entirety.

BACKGROUND

Microphones are deployed in various types of devices such as personal computers, cellular phones, mobile devices, headsets, headphones, and hearing aid devices. However, as the devices get smaller, they require smaller microphones. Smaller microphones suffer from higher acoustic noise caused by air flow within the device and often have lower signal-to-noise ratios than larger microphones.

BRIEF DESCRIPTION OF THE FIGURES

FIG. 2A is cross-sectional view of a schematic representation of a basic dielectric actuator according to implementations of the present disclosure.

Figure 1:
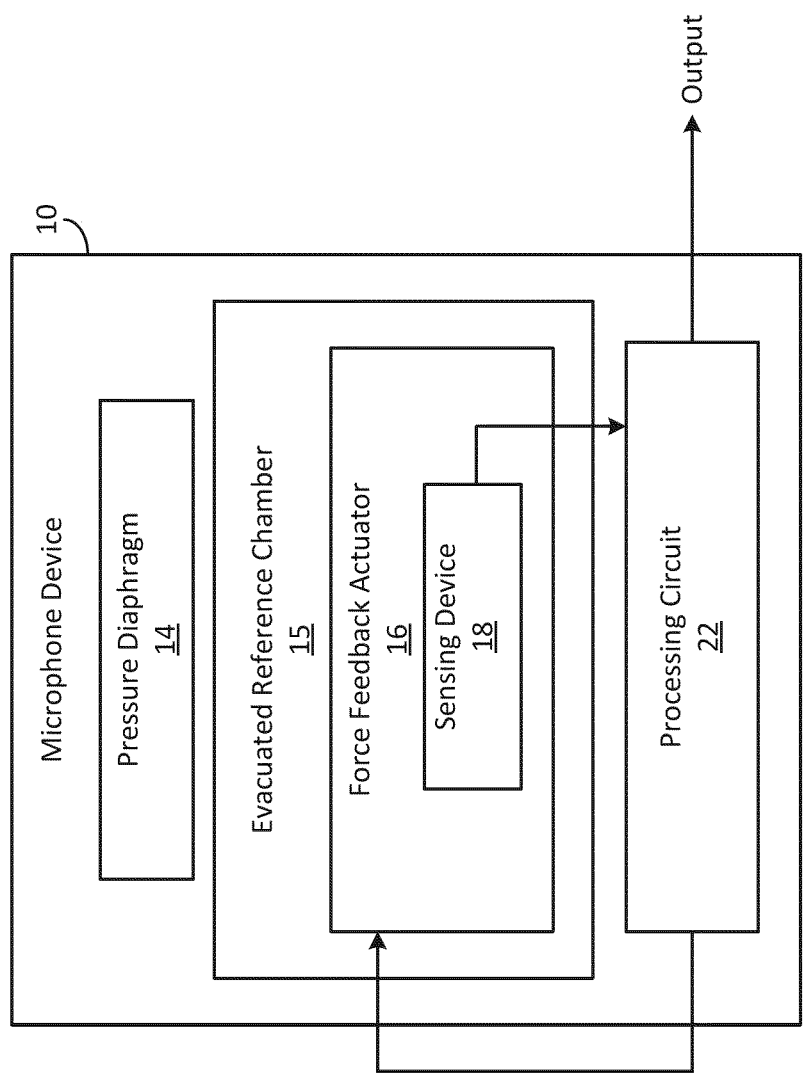
FIG. 1 is a schematic representation of a microphone device according to implementations of the present disclosure.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other drawings may be made, without departing from the sprit or scope of the subject matter presented here. It will be readily understood that aspects of the present disclosure, as generally described herein, and illustrated in the figures can be arranged, substituted, combined, and designed in a wide variety of different configurations, all of which are explicitly contemplated and make part of this disclosure.

DETAILED DESCRIPTION

Pressure microphones, which are by far the most prevalent form used, operate by having a diaphragm move in response to the difference in pressure between a first side of the diaphragm and a second side of the diaphragm. The first side is exposed to atmospheric pressure plus an acoustic pressure signal and the second side is exposed to an atmospheric reference pressure. The atmospheric reference pressure is supplied by a back volume which has an atmospheric equalization vent between the back volume and the outside environment. The atmospheric equalization vent is sized to prevent audio frequencies from entering the back volume. Accordingly, the pressure changes that occur within the back volume are low frequency pressure changes. Thus, the diaphragm of a pressure microphone responds to acoustic pressure differences above the vent cut-off frequency, which is typically tens of Hertz (Hz).

Performance losses in microphones and particularly in microelectromechanical systems (MEMS) microphones occur due to viscous losses from resistance to airflow within the device. In small MEMS capacitive microphones, the air flow through the back plate and through the atmospheric equalization vent can be major noise sources. The adverse impact of viscous losses on microphone performance increases as microphone size decreases. The viscous losses can be significantly reduced by encapsulating the MEMS device under low pressure or ideally under vacuum conditions. However, encapsulation under low pressure or vacuum conditions makes the MEMS device respond to atmospheric pressure changes, which typically overwhelms the desired acoustic signal. Atmospheric pressure at sea level is 100 kPa, which is about 3 orders of magnitude beyond the maximum acoustic pressure (200 Pa). Modern requirements are for a noise floor on the order of $10^{-4}$ Pa. Absolute pressure sensors have previously been contemplated for use as microphones, however it has heretofore been impractical to make such a device with a dynamic range of 1 billion (e.g., ranging between 0.0001 Pa-100 kPa). The present disclosure is related to counteracting atmospheric pressure by generating a counteracting electrostatic force. The function of the back volume is thus replaced by a force feedback signal to subtract the effect of the atmospheric pressure and leave the diaphragm to respond only to the desired acoustic pressure signal.

The present disclosure provides a MEMS transducer with a pressure diaphragm, the pressure diaphragm having the first side exposed to the environment while the second side is exposed to a closed chamber which is sealed at a low pressure near vacuum. In some implementations, the closed chamber has a pressure that is less than or substantially equal to 30 Pa. In some implementations, the closed chamber has a pressure that is less than or substantially equal to 10 Pa. Within the closed chamber is a dielectric grid engaged with an array of conductive pins for use with the MEMS transducer. The dielectric grid has two functions. The first function is to operate as an actuator to provide force feedback to the pressure diaphragm in order to offset the opposing force created by the atmospheric pressure. When a voltage is applied to adjacent pins, a force is created on the dielectric grid, pulling the dielectric grid parallel to the pins, further engaging the pins, thus increasing the capacitance between the pins. The second function of the dielectric grid is as a sensor. The low frequency portion of the sensed signal provides a way to adjust the force feedback voltage to compensate for atmospheric pressure changes while the high frequency portion of the sensed signal represents the desired acoustic signal.

As shown in FIG. 1, one implementation relates to a microphone device 10 including a pressure diaphragm 14, an evacuated reference chamber 15, a force feedback actuator 16, a sensing device 18, and a processing circuit 22. The pressure diaphragm 14 backed up with the evacuated reference chamber 15 effectively makes what is referred to as an absolute pressure sensor. The pressure diaphragm 14 responds to any changes in pressure including changes in atmospheric pressure and acoustic (e.g., sound) pressure. The pressure diaphragm 14 is designed to make physical contact with the actuator 16 and is designed to exert a force on the actuator 16 under atmospheric pressure conditions. The atmospheric pressure varies based on altitude and changes in weather conditions. Accordingly, as used herein, the term "atmospheric pressure" refers to pressures ranging between 30 kPa (e.g. at the peak of Mount Everest) and 110 kPa (e.g., at Dead Sea level). The force exerted by the pressure diaphragm 14 on the actuator 16 changes in response to changes in pressure. The pressure diaphragm 14 may be any type of device structured such that at least a portion of the pressure diaphragm 14 moves in response to pressure changes and changes the force exerted on the actuator 16. In some implementations, the pressure diaphragm 14 is configured to deflect in response to a change in pressure, such that a portion of the pressure diaphragm 14 contacts the actuator 16 while another portion of the pressure diaphragm 14 remains fixed. The changes in pressure may be a change in an ambient atmospheric pressure and/or a change in pressure caused by an acoustic pressure (e.g. a sound). The actuator 16 is configured to move when contacted by the pressure diaphragm 14 (e.g., in response to the force exerted by the pressure diaphragm 14).

The sensing device 18 is configured so that deflection of the actuator 16 in response to a change in pressure (e.g., due to a change in atmospheric pressure or a change in pressure due to acoustic activity such a sound) causes a change in capacitance of the sensing device 18.

The processing circuit 22 is configured to monitor changes in the capacitance of the sensing device 18 and generate an electrical signal based on the capacitance of the sensing device 18 (e.g., the signal is indicative of changes in the capacitance). The processing circuit 22 generates data and/or signals indicative of acoustic activity (i.e., acoustic signals and/or data) and data and/or signals indicative of the atmospheric pressure (i.e., atmospheric pressure signals and/or data). The processing circuit 22 is then configured to process the electrical signal to generate a bias signal and an acoustic signal. The bias signal is indicative of changes in the atmospheric pressure and is configured to compensate for deflection of the sensing device 18 that is due to a change in the atmospheric pressure. For example, in some implementations, the bias signal may command a voltage source coupled to the actuator device 16 to change a bias voltage applied to the actuator device 16 to reposition the actuator device 16 to compensate for the change in atmospheric pressure. The acoustic signal is indicative of changes in pressure due to acoustic pressure (e.g., due to one or more sounds). The acoustic signal(s) and/or data may be stored in a memory (e.g., of the processing circuit and/or a memory device in wired or wireless communication with processing circuit 22). The acoustic signals and/or data may also be sent via a wireless or wired connection to a receiving device, such as a speaker, CODEC, phone, etc. In some implementations, the acoustic signals and/or data may be corrected to compensate for non-linearity of the sensing device, variations that occurred during manufacturing, and/or temperature. In such implementations, compensation coefficients for use in the compensation may be stored in the memory.

Figure 2:
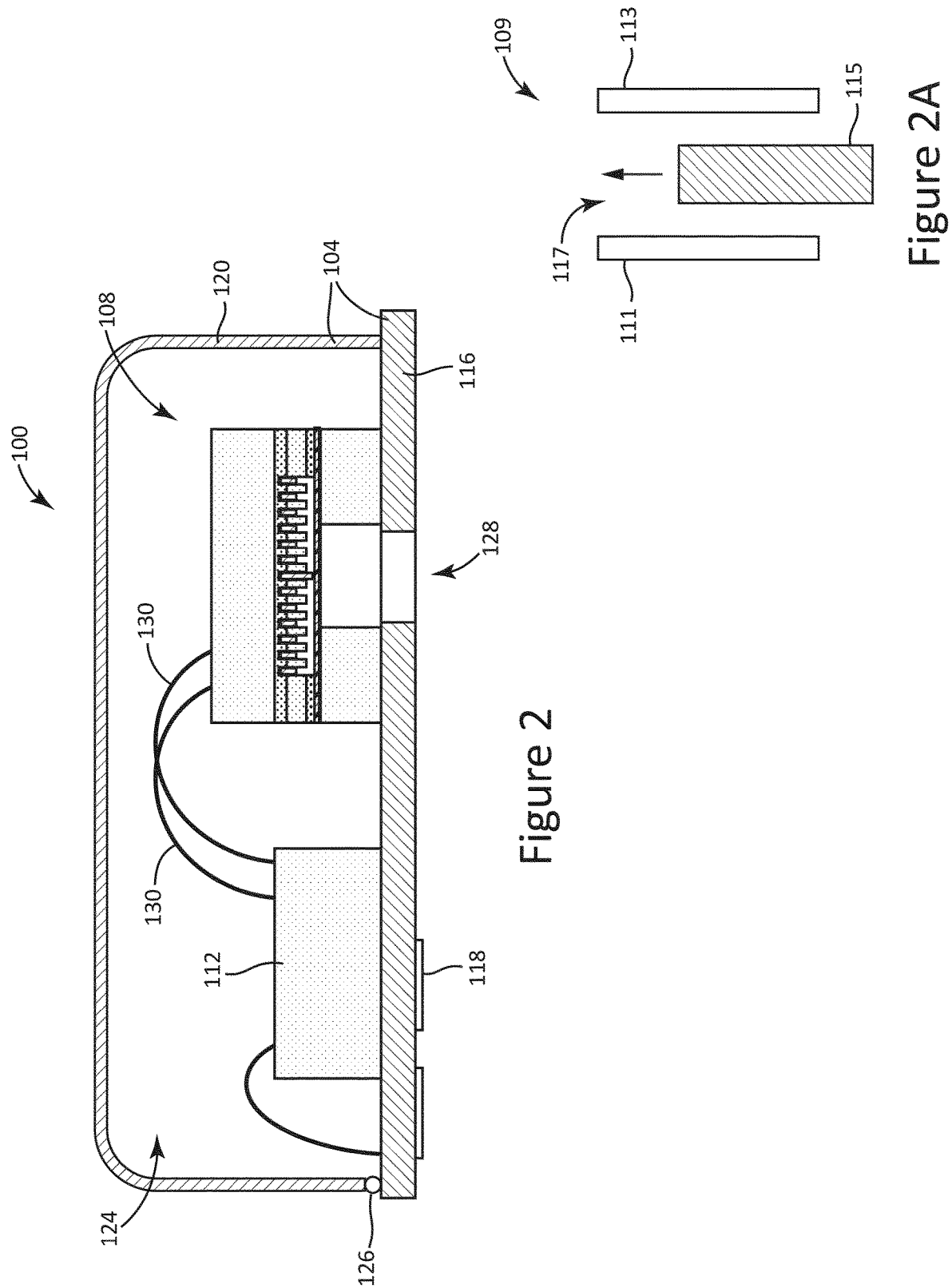
FIG. 2 is a cross-sectional view of a schematic representation of a microphone device including a dielectric actuator according to implementations of the present disclosure.

FIG. 2 shows a cross-sectional view of a microphone device 100 according to an implementation of the present disclosure. While the microphone device 100 illustrated in FIG. 2 and subsequent figures of the present disclosure represents illustrative implementations of the features of the present disclosure, it should be understood that, in some implementations, other structural features may be used to implement the features described above with respect to FIG. 1 and described in further detail below.

The microphone device 100 includes a housing 104, a MEMS transducer 108, and an integrated circuit (IC) 112. The housing 104 includes a device substrate 116 and a cover 120. The housing 104 includes an exterior surface. The cover 120 is secured to the device substrate 116 so that the cover 120 and the device substrate 116 define an interior portion 124 therebetween. The cover 120 includes an atmospheric equalization vent 126, in some implementations. The atmospheric equalization vent 126 is configured to provide fluid communication between the exterior of the housing 104 and the interior portion 124. The atmospheric equalization vent 126 protects the housing 104 from extreme temperatures and/or pressures. The MEMS transducer 108 and the IC 112 are positioned within the interior portion 124. The device substrate 116 includes a sound port 128. The sound port 128 is generally aligned with the MEMS transducer 108 such that the MEMS transducer 108 is exposed to pressure changes through the sound port 128. In some embodiments, the MEMS transducer 108 can be mounted adjacent to the sound port 128. In some embodiments, the sound port 128 can be formed in the cover 120. In these cases, the MEMS transducer 108 may be inverted from that shown in the figure. At least a portion of the MEMS transducer 108 is in fluid communication with an exterior of the housing 104 through the sound port 128. The MEMS transducer 108 can generate electrical signals based on the pressure changes. The pressure changes may be changes in the ambient atmospheric pressure (e.g., a pressure of the outside environment of the microphone device 100) or may be pressure changes caused by an acoustic stimulus such as a sound. The IC 112 can process the electrical signals generated by the MEMS transducer 108. In the illustrated embodiment, the IC 112 can extract an acoustic portion of the electrical signal that is based on changes in an acoustic pressure to the audio processing circuitry. The IC 112 can extract an atmospheric portion of the electrical signal that is based on changes in the ambient atmospheric pressure and generate a bias signal based on the atmospheric portion of the electrical signal. As is discussed in greater detail below, the bias signal can compensate for the effect of the changes in the atmospheric pressure.

The MEMS transducer 108 is coupled to the IC 112. More specifically, in some implementations, the MEMS transducer 108 may be hardwired to the IC 112 using leads and traces 130 to form an electrical connection between the MEMS transducer 108 and the IC 112. IC 112 is also electrically connected to the device substrate 116 and to pads 118 for communication with the device to which the microphone 100 is connected. The IC 112 can include acoustic signal and atmospheric signal processing circuitry and/or software, as discussed in further detail below.

FIG. 2A illustrates a basic dielectric actuator that includes a parallel plate capacitor 109 that includes a first electrode 111, a second electrode 113, and a dielectric element 115. The dielectric element 115 is at least partially inserted into a gap 117 between the electrodes 111, 113. The dielectric element 115 can move relative to the electrodes 111, 113. When a voltage is applied between electrodes 111, 113 a force is created on the dielectric element 115 that pulls the dielectric element 115 into the gap 117 in the direction of the arrow, thus increasing the capacitance. This concept can be replicated in two dimensions with an array of pins as the electrodes and a dielectric grid fashioned to fit between the pins as explained further below.

Figure 3:
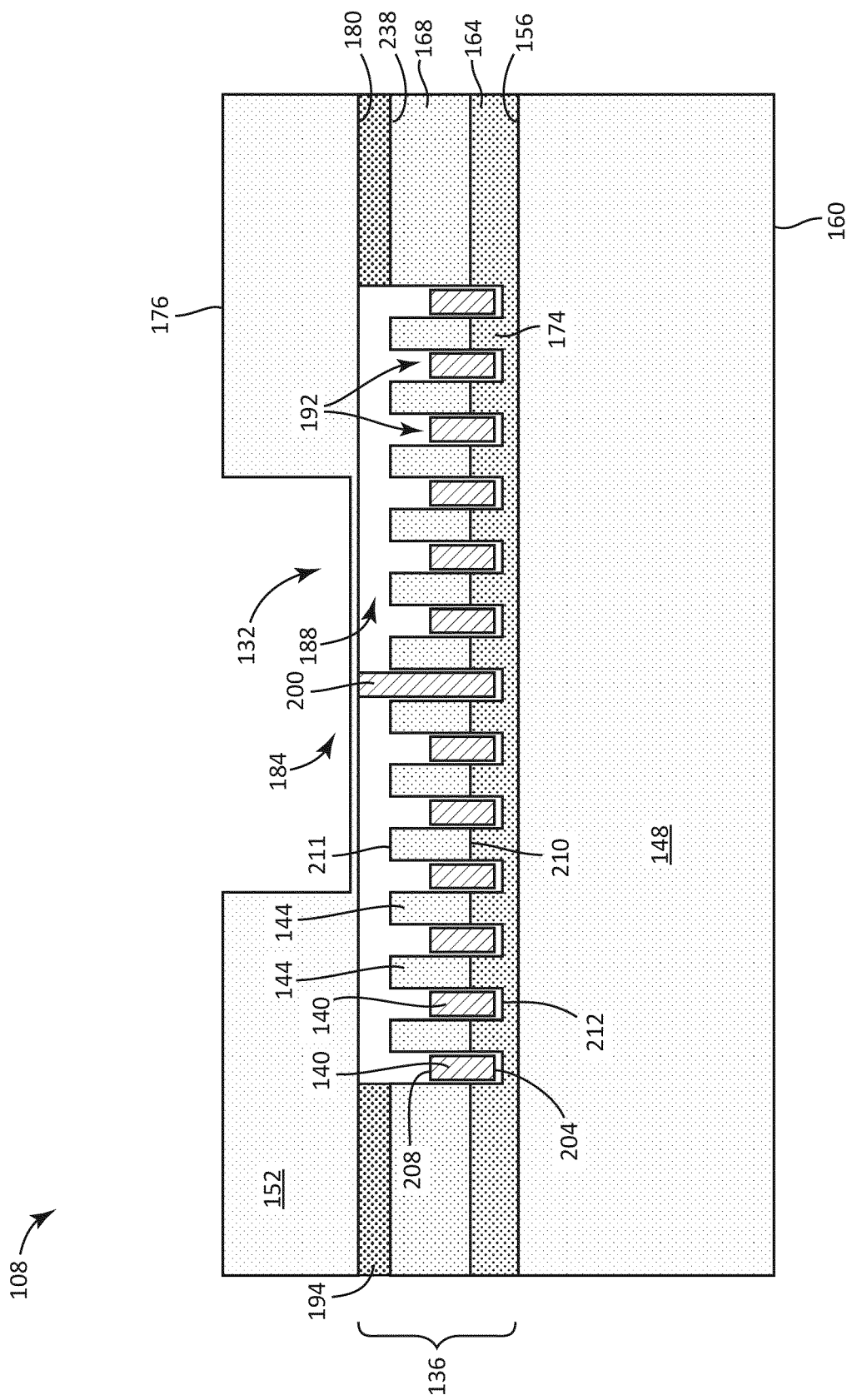
FIG. 3 is a cross-sectional view of the dielectric actuator of the microphone device of FIG. 2 according to implementations of the present disclosure.

FIG. 3 illustrates a cross-sectional view of a schematic representation of the MEMS transducer 108. The MEMS transducer 108 is illustrated in an orientation that is rotated approximately 180° from the orientation illustrated in FIG. 2. As illustrated in FIG. 3, the MEMS transducer 108 includes a flexible pressure diaphragm 132 and a force feedback actuator and sensing device or dielectric actuator 136 including the dielectric grid 140 and the conductive pins 144. The dielectric actuator 136 is formed in the first substrate 148 and the flexible diaphragm 132 is formed in a second substrate 152. The first substrate 148 and the second substrate 152 are secured together to form the MEMS transducer 108. The first substrate 148 and the second substrate 152 are positioned so that the pressure diaphragm 132 is adjacent the dielectric actuator 136. When the MEMS transducer 108 is under atmospheric pressure conditions, the pressure diaphragm 132 is held in contact with the dielectric actuator 136 by the atmospheric pressure. In some embodiments, the first substrate 148 and the second substrate 152 are silicon substrates. In some embodiments, the first substrate 148 and/or the second substrate 152 is a silicon-on-insulator (SOI) wafer.

The first substrate 148 includes a first surface 156 and an opposing second surface 160. A first insulating layer 164 and a first conductive layer 168 are formed on the first surface 156 of the first substrate 148. The conductive pins 144 are formed in (e.g. etched into) the first conductive layer 168 with the etch continuing partially into the first insulating layer 164. Each of the conductive pins 144 thus is seated on an insulating protrusion 174 approximately the same size as the conductive pins 144. The conductive pins 144 are formed on the insulating portions 174 to electrically isolate the conductive pins 144 from the first substrate 148. A plurality of channels 192 extend adjacent the conductive pins 144. A portion of the channels 192 is adjacent the conductive pins 144 and a portion of the channels 192 is adjacent the insulating protrusions 174. The dielectric grid 140 is positioned within the plurality of channels 192. The dielectric grid 140 includes a plurality of through-openings for receiving the conductive pins 144. The width of the through-openings in the dielectric grid 140 is greater than the width of the conductive pins 144 thus allowing the dielectric grid 140 to move. The dielectric grid 140 is movably mounted (e.g., by springs) to the first substrate 148. As explained earlier, a necessary condition for a dielectric actuator is that the dielectric be at least partially inserted into the capacitive gap between the conductive pins 144. The bottom surface 204 of the dielectric grid 140 is thus below the bottom surface 210 of the conductive pins 144 and the top surface 208 of the dielectric grid 140 is below the top surface 211 of the conductive pins 144.

The second substrate 152 includes a first surface 176 and an opposing second surface 180. A cavity 184 is formed in the first surface 176 and extends through a portion of the second substrate 152 towards the second surface 180 of the second substrate 152. The cavity 184 does not extend through the second surface 180. The portion of the second surface 180 adjacent the cavity 184 forms the flexible diaphragm 132 that can deflect in response to pressure changes.

The second surface 180 of the second substrate 152 is secured to the first surface 156 of the first substrate 148 (e.g., via one or more intervening layers/materials, as illustrated in FIG. 3), forming an evacuated reference chamber 188 therebetween. The reference chamber 188 includes the channels 192. In some embodiments, the second surface 180 of the second substrate 152 may be secured to the first surface 156 of the first substrate 148 by a eutectic solder 194, the first conducting layer 168, and the first insulating layer 164. The dielectric grid 140 includes the through-openings and an actuator protrusion 200. When not in operation, atmospheric pressure causes diaphragm 132 to press on protrusion 200 thus forcing the dielectric grid 140 to "bottom out" in the channels 192, where the bottom surface 204 of the dielectric grid 140 comes in contact with the bottom surface 212 of the channels 192. Bottoming out prevents the structure from breaking under the very high atmospheric load. In operation, a voltage is applied to adjacent conductive pins 144, producing a force on the dielectric grid 140, lifting it off the bottom of the channels 192, and permitting it to move in response to very small movements in the diaphragm when exposed to acoustic signals.

The diaphragm 132 is configured to convert a pressure change into a physical motion of the dielectric actuator 136 that changes a capacitance of the dielectric actuator 136. The diaphragm 132 is secured to the first substrate 148 to form a portion of the reference chamber 188. The diaphragm 132 has a first side that is exposed to the atmospheric pressure and acoustic pressures (e.g., sounds) and a second side that is exposed to the reference chamber 188. In the illustrated embodiment, the reference chamber 188 is a vacuum and forms an evacuated reference chamber. The diaphragm 132, the dielectric actuator 136, and the reference chamber 188 form an absolute pressure sensor, in that the dielectric actuator 136 can be used to sense changes in atmospheric pressure and can be biased to compensate for such changes. In the implementation illustrated in FIG. 3, the diaphragm 132 is flexible. Under atmospheric pressure conditions, the diaphragm 132 is in held in physical contact with the dielectric grid 140 by the atmospheric pressure and exerts a force on the dielectric grid 140. More specifically, the diaphragm 132 is held in physical contact with the actuator protrusion 200 of the dielectric grid 140. Changes in pressure (e.g., changes in the atmospheric pressure and/or changes in acoustic pressure) cause the diaphragm 132 to deflect (e.g. upwards or downwards) and increase or decrease the force exerted on the actuator protrusion 200 of the dielectric grid 140, causing the dielectric grid 140 to deflect with respect to the conductive pins 144. The deflection of the dielectric grid 140 changes an overlap area between adjacent conductive pins 144, which causes a change in a capacitance between adjacent conductive pins 144. The change in capacitance between adjacent conductive pins 144 is sensed by the IC 112. The IC 112 can extract an acoustic portion of the electrical signal that is caused by the acoustic activity and process the acoustic portion of the signal to generate an output representative of the acoustic activity. The IC 112 can extract an atmospheric portion of the electrical signal that is caused based on changes in the ambient atmospheric pressure and generate a feedback signal based on the atmospheric portion of the electrical signal.

The feedback signal can compensate for the effect of the changes in the atmospheric pressure.

In some implementations, the reference chamber 188 of the dielectric actuator 136 has a pressure that is less than the atmospheric pressure (e.g., is a vacuum). In some implementations, the reference chamber 188 has a pressure that is at least four orders of magnitude less than the atmospheric pressure. In some implementations, the reference chamber has a pressure that is less than 30 Pa, such as less than 10 Pa. In some implementations, the term "vacuum" is used to indicate pressures less than or equal to 10 Pa. In some implementations, the term "vacuum" is used to indicate pressures less than or equal than 30 Pa. The lack of air (due to the presence of the low pressure region/vacuum) reduces noise by reducing air damping on all moving elements within the reference chamber 188. While the embodiment illustrated in FIG. 3 includes one actuator protrusion 200, in other embodiments, more than one actuator protrusion can be used.

Figure 4:
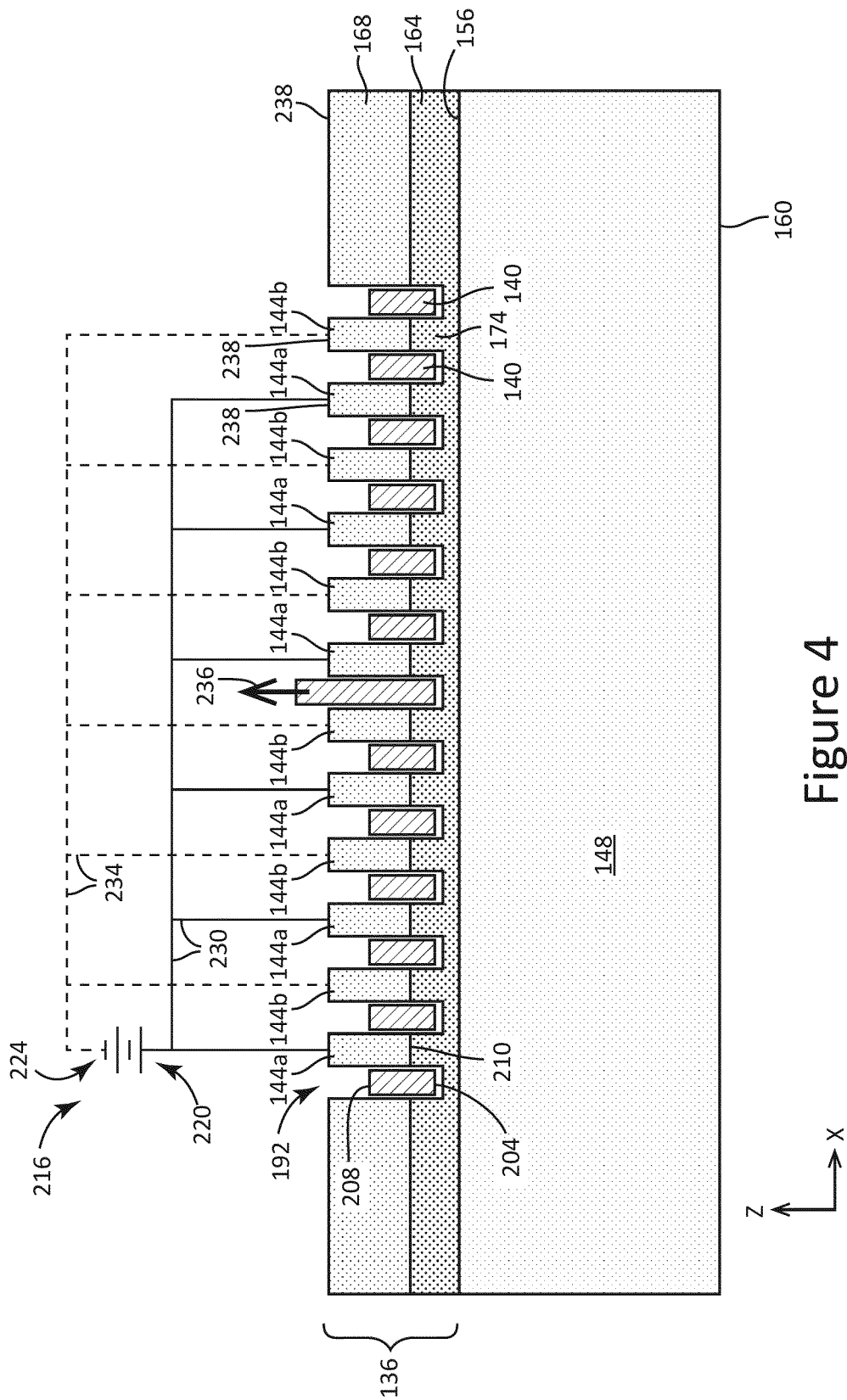
FIG. 4 is a cross-sectional view of the dielectric actuator of the microphone device of FIG. 2 according to implementations of the present disclosure.

FIG. 4 illustrates a cross-sectional schematic representation of the dielectric actuator 136 engaged with a voltage source 216 having a positive terminal 220 and a negative terminal 224. Each pair of adjacent conductive pins 144 form a capacitive cell which is coupled to the voltage source 216. All of the capacitive cells are connected in parallel. More specifically, each of the conductive pins 144 may be hardwired to the voltage source 216 using leads and traces to form an electrical connection. As is described in greater detail below, the voltage source 216 is configured to provide a bias voltage to the conductive pins 144 to counteract a force exerted by the atmospheric pressure on the diaphragm 132. The voltage source 216 can be configured to adjust an amount of the bias voltage provided to adjacent conductive pins 144 to reposition the dielectric grid 140 to substantially counteract changes in the atmospheric pressure.

The voltage bias applied between the adjacent conductive pins 144a and 144b generates an electrostatic force F that pulls the dielectric grid 140 upwards (e.g., towards a top surface 238 of the first conductive layer 168) into the channels 192 positioned between the conductive pins 144. In the illustrated implementation, increasing an overlap area (e.g., moving the dielectric grid 140 in the direction shown by the arrow 236) increases a capacitance between adjacent conductive pins 144. The energy in a capacitor is determined by the following equation:

$$E = \tfrac{1}{2} C V^2 \qquad (1),$$

where E is the energy stored in the capacitor, C is the capacitance of the capacitor (e.g., a capacitance between adjacent conductive pins 144), and V is the voltage provided by the voltage source 216. The force, F, on the dielectric grid 140 as it moves with respect to the adjacent conductive pins 144 is determined by the following equation:

$$F = \frac{\partial E}{\partial z} = \frac{1}{2} \frac{\partial C}{\partial z} V^2, \qquad (2)$$

where F is the force on the dielectric grid, E is the energy stored in the capacitor, C is the capacitance of the capacitor (e.g., the capacitance between adjacent conductive pins 144), V is the voltage provided by the voltage source 216, and z is the vertical distance moved by the dielectric grid 140. If the ends of the dielectric grid 140 are at least the width of the lateral gap between the dielectric grid 144 and the conductive pins 144 away from the ends of the conductive pins 144, the fringing capacitance is negligible and thus the capacitance between the adjacent conductive pins 144 varies approximately linearly with the dielectric grid displacement. Hence the force, F is nearly constant (for a given voltage) over this displacement range. In addition, unlike the commonly used actuator where two sets of conductive fingers are interdigitated, one set fixed and one set moveable, there is very little lateral force on the dielectric grid. This is because the change in capacitance in the lateral (x) direction is quite small since only small fringing fields exist in this device.

Figure 5:
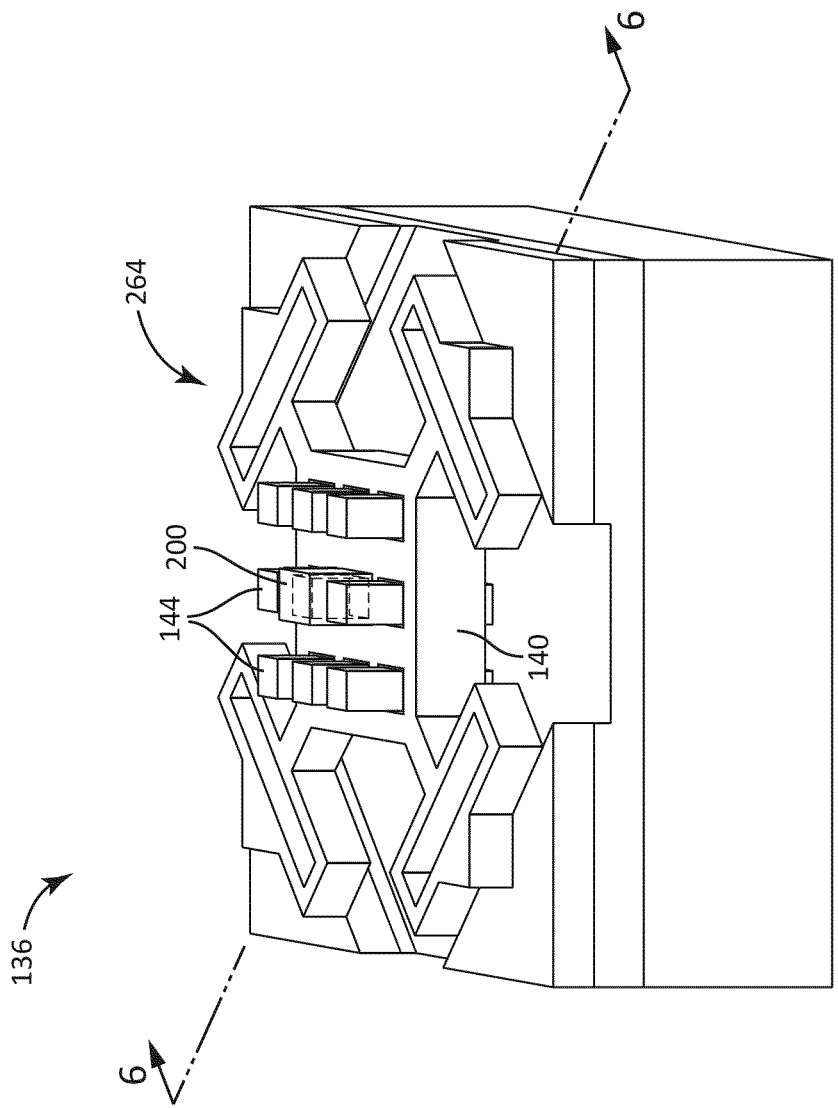
FIG. 5 is a dielectric actuator for use with the microphone device of FIG. 2 according to implementations of the present disclosure.

FIG. 5 illustrates a perspective view of a simplified force feedback actuator or dielectric actuator 136 portion of the MEMS transducer. In the illustrated embodiment, the dielectric grid 140 is suspended via a plurality of springs 264. The springs 264 allow the dielectric grid 140 to deflect in a direction that is generally perpendicular to a plane defined by the substrate 148. FIG. 5 shows the springs 264 in a neutral position in which the springs 264 are not deflected. The dielectric grid 140 can be maintained in or near the neutral position by adjusting an amount of voltage supplied to the conductive pins 144. Each of the springs 264 is secured to a corner of the dielectric grid 140 so that the dielectric grid 140 remains substantially perpendicular to the conductive pins 144 as the dielectric grid 140 deflects. The springs 264 are oriented such that the dielectric grid 140 is held parallel to the plane defined by the substrate 148 as the dielectric grid 140 deflects.

Figure 6:
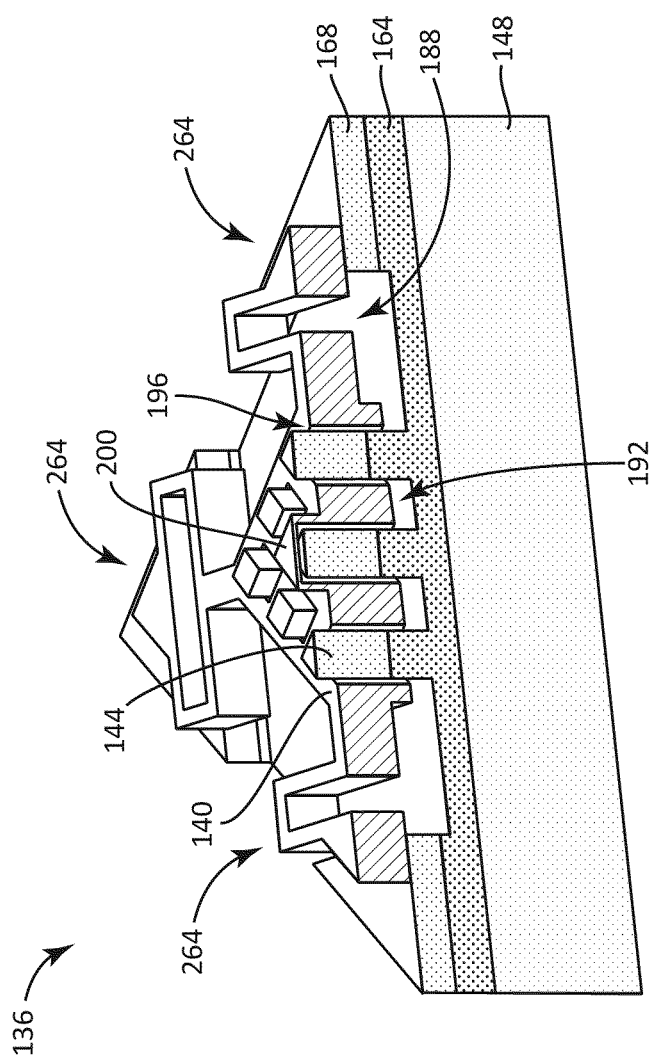
FIG. 6 is a cross-sectional view of the dielectric actuator of FIG. 5 taken along the lines 6-6.

The dielectric grid 140 includes holes that each receive one of the conductive pins 144. Accordingly, the conductive pins 144 are an array of conductive pins 144 distributed in two dimensions and having gaps (e.g., the channels 192) formed therebetween (e.g., a contiguous grid of dielectric material). The dielectric grid 140 can include the actuator protrusion 200 that extends above a plane defined by the top surfaces of the conductive pins 144, as described above with respect to FIG. 3. FIG. 6 illustrates a cross-sectional view of the dielectric actuator 136 taken along the section lines 6-6 shown in FIG. 5.

Figure 7:
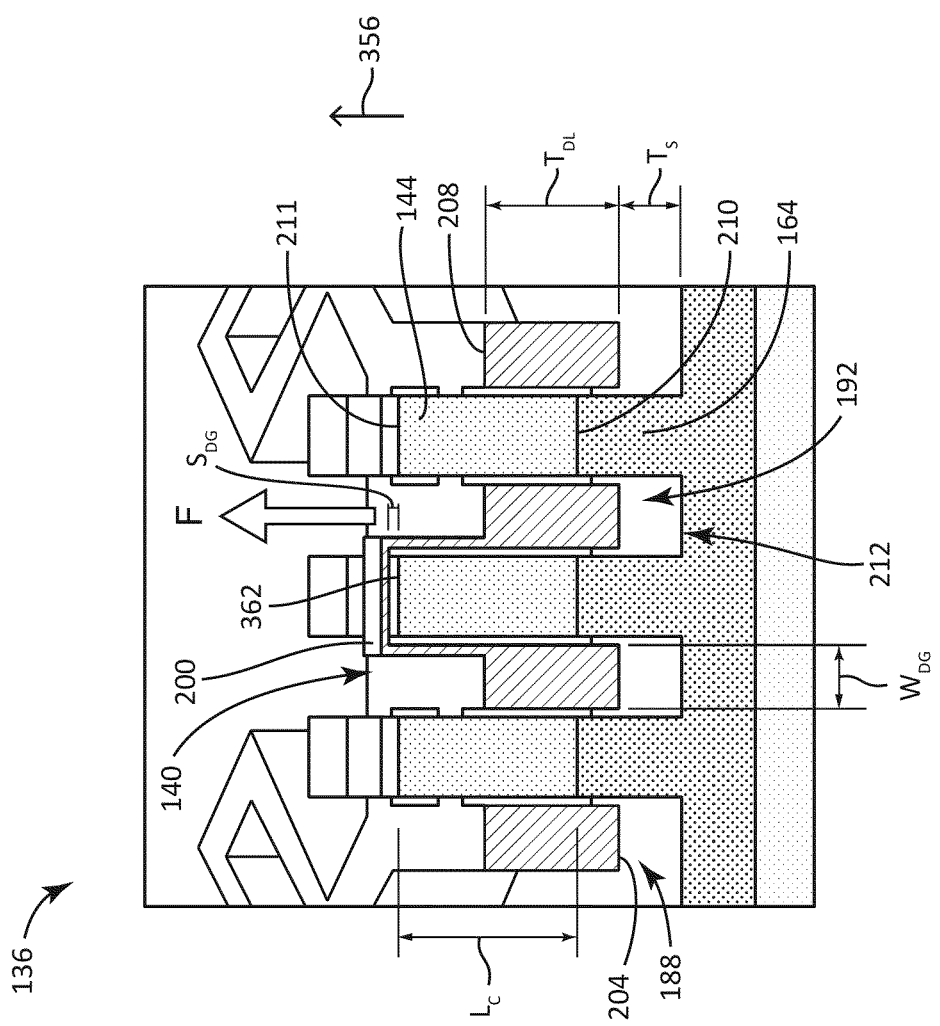
FIG. 7 is a cross-sectional detail view of the dielectric actuator of FIG. 5.

FIG. 7 illustrates a section view of a portion of the dielectric grid 140 engaged with the conductive pins 144. As shown in FIG. 7, each of the conductive pins 144 is positioned on one of a plurality of protrusions or insulating portions 174 formed from the insulating layer 164. The plurality of insulating portions 174 electrically isolate the plurality of conductive pins 144 from the first substrate 148.

The conductive pins 144 have a length $L_c$ that is approximately 5 μm. The channels have a width $W_C$ of approximately 2 μm. In the embodiment illustrated in FIG. 7, the conductive pins 144 are solid pins made of a silicon material. In other embodiments, the conductive pins 144 may be formed by plated metal (e.g., by plating a metal layer over a protrusion made from a dielectric material). The dielectric grid 140 has a thickness $T_{DL}$ of approximately 5 μm. The width $W_{DG}$ of the dielectric grid 140 that extends between adjacent conductive pins 144 is approximately 1.5 μm. In the illustrated embodiment, the dielectric grid 140 is made of silicon nitride. A spacing $T_S$ between the first surface 204 of the dielectric grid 140 and the closed ends 212 of the channels 192 is approximately 0.25 μm. The sides of each the holes in the dielectric grid 140 are spaced approximately 0.25 μm from each of the conductive pins 144. The bottom surface 204 of the dielectric grid is approximately 2 μm below the bottom surface 210 of the conductive pins 144. The top surface 362 of the conductive pin 144 surrounded by the actuator protrusion 200 of the dielectric grid 140 has a spacing SDG spaced approximately 0.25 μm from the actuator protrusion 200. Accordingly, the dielectric grid 140 can deflect up to 0.25 μm with respect to the conductors in a direction opposite that indicated by the arrow 356 and up to 1 μm in the direction indicated by the arrow 356. In the embodiment illustrated in FIG. 7, the conductive pins 144 are polysilicon and the first insulator 164 is silicon oxide.

Figure 8:
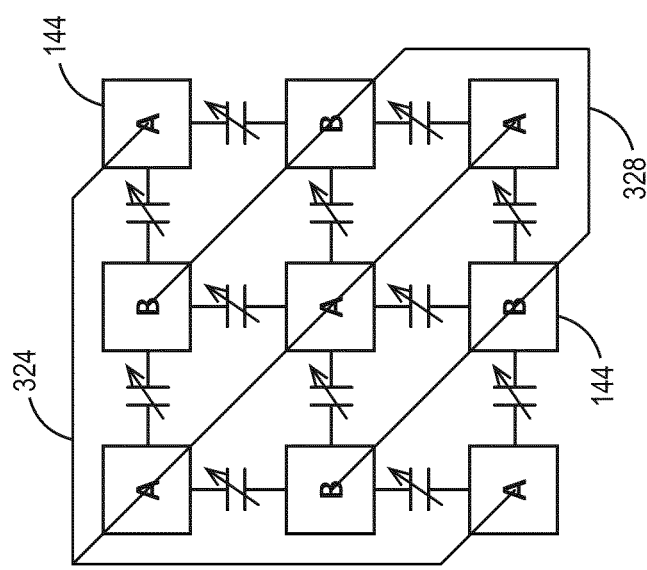
FIG. 8 is a top view of the dielectric actuator of FIG. 5 according to implementations of the present disclosure.

FIG. 8 illustrates how a two dimensional array of conductive pins 144 can be interconnected with two sets of interdigitated diagonally oriented leads. FIG. 8 illustrates a first plurality of conductive pins 144*a* and a second plurality of conductive pins 144*b*. The first plurality of conductive pins 144*a* are connected by a first set of interdigitated leads 324. The second plurality of conductive pins 144*b* are connected by a second set of interdigitated leads 328.

Figure 9A:
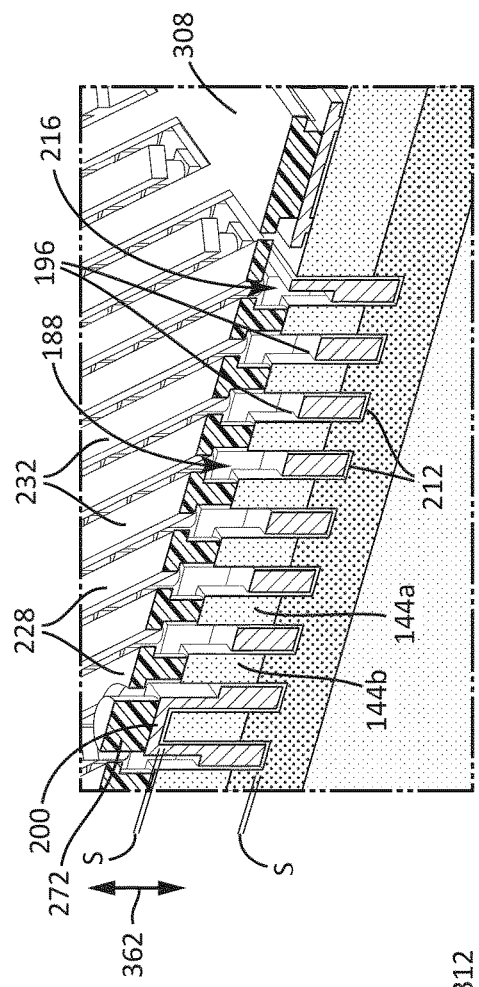
FIG. 9 is a perspective view of a dielectric actuator of the microphone device of FIG. 2 according to implementations of the present disclosure. Inset 9A illustrates a detail view of the dielectric actuator.
Figure 9:
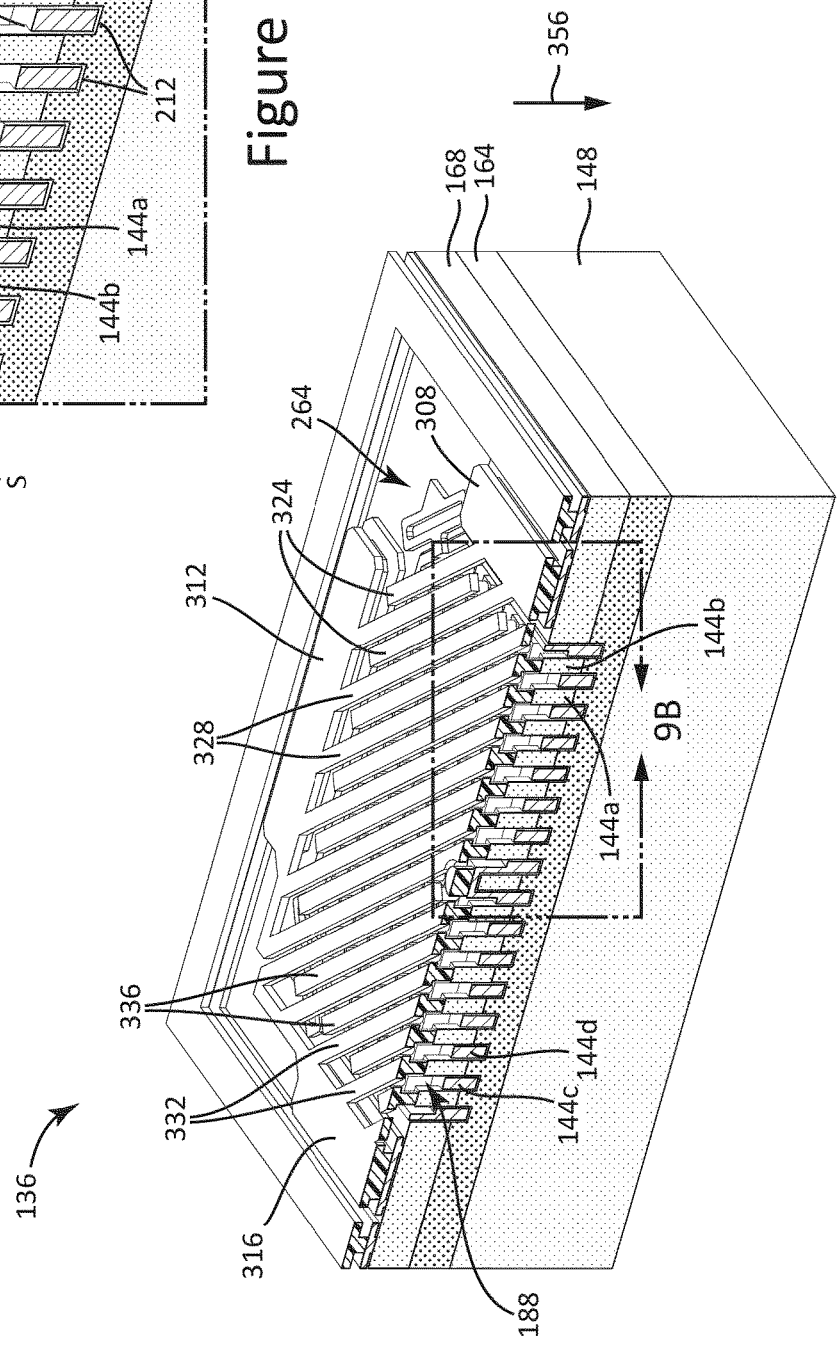

FIG. 9 illustrates a section view of a dielectric actuator 136 according to another embodiment. The dielectric actuator 136 illustrated in FIG. 9 is a more detailed example implementation of a transducer similar to that shown in FIG. 3, and, accordingly, like parts are described using the same reference numerals as their corresponding elements in FIG. 3.

FIG. 9 illustrates the electrical connections for connecting the conductive pins 144 to a voltage source. In the manner consistent with FIG. 8, the conductive pins 144 are interconnected with interdigitated leads oriented diagonally with respect to the array of conductive pins 144. Each lead contacts the top of conductive pins 144 underneath the lead. The conductive pins 144 can be interconnected into a single capacitive cell functioning both as an actuator and as a sensor or the conductive pins 144 can be interconnected into two capacitive cells, as illustrated in FIG. 9, where one cell acts as an actuator and the other cell acts as the sensor. The dielectric actuator 136 includes a plurality of conductive pads. A conductive pad is connected to each of the interdigitated leads to provide electrical communication between the conductive pins 144 and the ASIC 122. The plurality of pads includes a first pad 308, a second pad 312, a third pad 316, and a fourth pad (not shown) that are configured to be connected to the ASIC 122. A first plurality of interdigitated leads 324 extends from the first pad 308, a second plurality of interdigitated leads 328 extends from the second pad 312, a third plurality of interdigitated leads 332 extends from the third pad 316, and a fourth plurality of interdigitated leads 336 extends from the fourth pad. The pads 308, 312, 316, and the interdigitated leads 324, 328, 332, 336 are substantially similar, in some implementations. An electrically isolated portion of the material used to form the interdigitated leads 324, 328, 332, 336 is formed on top of the actuator protrusion 200. The interdigitated leads 324, 328, 332, 336 are situated above the conductive pins 144 but below the upper surface of the actuator protrusion 200 (with the exception of the lead material 272) so that when the pressure diaphragm 132 depresses the actuator protrusion 200 the maximum amount (bottoming out the dielectric grid 140 in the channels 192) the pressure diaphragm 132 does not contact the interdigitated leads 324, 328, 332, 336.

The inset 9A illustrates the electrical connections between the interdigitated leads 324, 328, 332, 336 and the conductive pins 144. The conductive pins 144 includes a plurality of first conductive pins 144*a*, a plurality of second conductive pins 144*b*, a plurality of third conductive pins 144*c*, and a plurality of fourth conductive pins 144*d*. Each of the pluralities of conductive pins 144*a*, 144*b*, 144*c*, 144*d* is connected to one of the pads 308, 312, 316, 320, respectively. The pads 308, 312, 316, 320 are independently connected to the ASIC 122. The illustrated embodiment includes substantially an equal amount of first conductive pins 144*a*, second conductive pins 144*b*, third conductive pins 144*c*, and fourth conductive pins 144*d*. In other embodiments, the proportion of the conductive pins 144*a*, 144*b*, 144*c*, 144*d* may be different. The capacitance between the adjacent conductive pins 144 changes as changes in pressure cause the diaphragm to move and contact the actuator protrusion 200. The capacitance across at least some of the adjacent conductors can be sensed by the integrated circuit. In some embodiments, the capacitance changes may be sensed across the first conductive pins 144*a* and the second conductive pins 144*b* and the bias voltage to control the position of the dielectric grid may be applied across third conductive pins 144*c* and fourth conductive pins 144*d*. In some implementations, the number of conductive pins across which the bias voltage is applied may be different than the number across which the pressure changes are sensed (e.g., the design may include more (or less) sensing conductors than actuator conductors across which the bias signal is applied).

Figure 10:
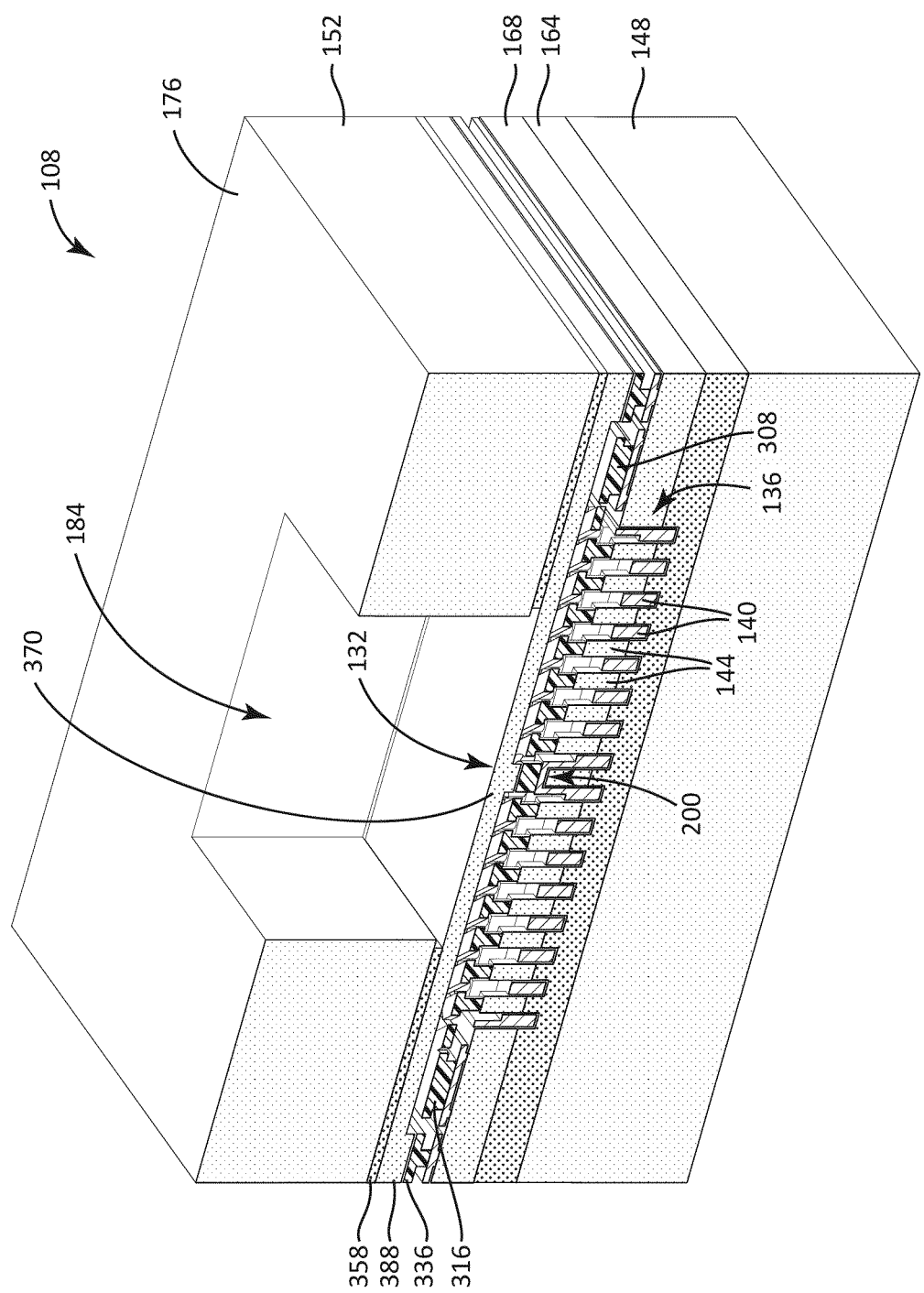
FIG. 10 is a perspective view of the dielectric actuator of the microphone device according to FIG. 2 according to implementations of the present disclosure.

FIG. 10 illustrates a cross sectional view of the MEMS transducer 108 including the dielectric actuator 136 and the diaphragm 132. The diaphragm 132 is secured to the second substrate 152. In some embodiments, as described with respect to FIG. 3, the diaphragm may be formed from the second substrate, e.g., as one contiguous material. In the illustrated embodiment, the diaphragm 132 is secured to the second substrate 152 by anchors 336 which also serve to seal the edge of the cavity 188. The first substrate 148 is secured to the second substrate 152 so that the diaphragm 132 is positioned adjacent the dielectric actuator 136. Under atmospheric pressure conditions, the diaphragm 132 is held in contact with the dielectric actuator 136 by the atmospheric pressure. The first surface 156 of the first substrate 148 is secured to the device substrate 116 of the microphone device 100 (FIG. 2). In a secured position, the cavity 188 is generally aligned with the sound port 128 of the microphone device 100. Accordingly, changes in atmospheric and/or acoustic pressure proximate the sound port 128 cause deflection of the diaphragm 132. Deflection of the diaphragm 132 causes deflection of the dielectric grid 140 of the dielectric actuator 136, generating an electric signal, which can be processed as is described herein. Alternatively, surface 176 of the second substrate 152 can be secured to the device substrate 136 adjacent to the sound port 128 or the sound port 128 can be formed in the cover 120. Access to the pads 308, 312, 316, 320 can be provided in any of several well-known manners such as Through-Silicon-Vias (TSV). A second manner includes positioning the anchors 336 inside the region containing the pads 308, 312, 316, 320 and making the second substrate 152 smaller than that of the first substrate 148 so that the pads 308, 312, 316, 320 are exposed.

With continued reference to FIG. 10, an optional actuator tab 370 of the diaphragm 132 is positioned in the cavity 188 and generally aligned with the actuator protrusion 200 of the dielectric grid 140. The voltage source provides a bias voltage to at least a portion of the conductive pins 144 to suspend the dielectric grid 140 in a neutral position (e.g., a position in which the springs 264 are not deflected and the dielectric grid 140 is spaced from the ends of the channels 192). The neutral position is illustrated in FIG. 10. As the diaphragm 132 extends and retracts within the cavity 188 in response to changes in acoustic and/or atmospheric pressure, the force exerted by the actuator tab 370 on the dielectric grid 140 changes, such that the dielectric grid 140 is either moved towards the ends of the channels 192 or away from the ends of the channels 192. When the bias voltage is not applied to the conductive pins 144 (e.g., when the voltage source 216 is turned off), the atmospheric pressure pushes the dielectric grid 140 against the ends of the channels 192. The ends of the channels 192 therefore act as a mechanical stop for the dielectric grid 140. The lack of air in the cavity 188 (due to the presence of the low pressure region/vacuum) reduces noise by reducing the air damping of the diaphragm 132 and the dielectric grid 140 as the dielectric grid 140 extends and retracts within the cavity 188.

Figure 11:
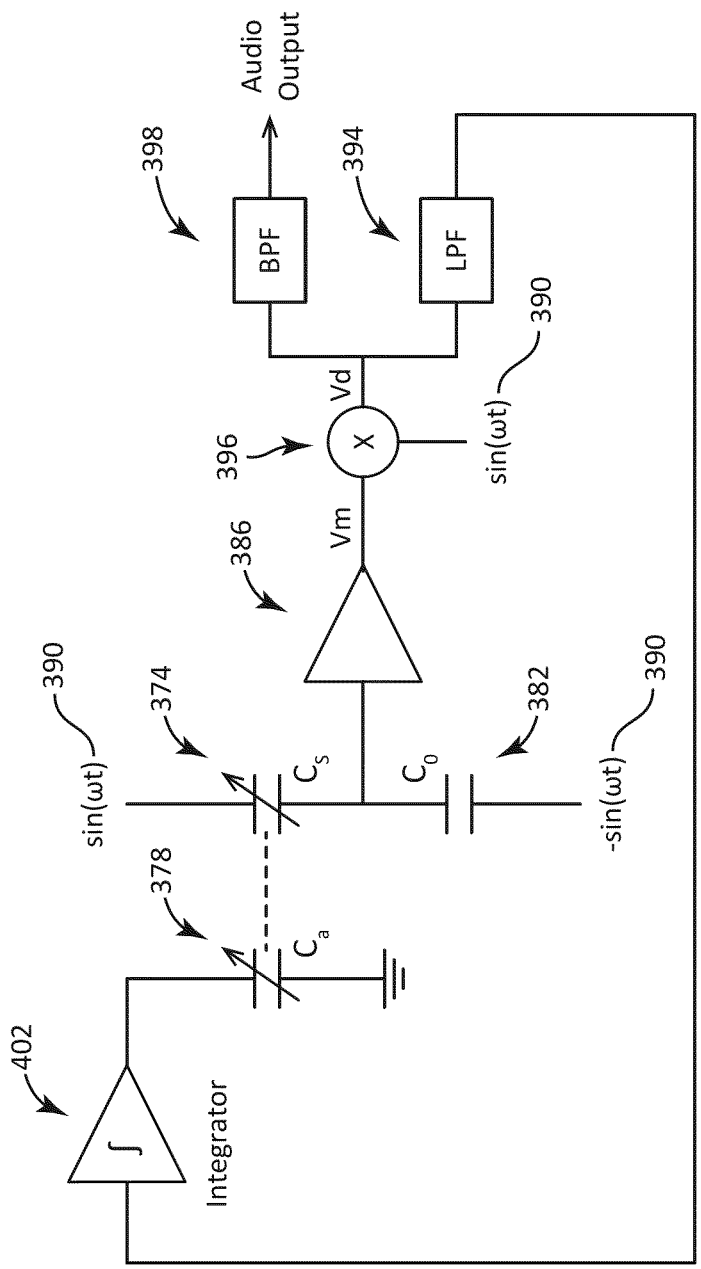
FIG. 11 is a representation of the integrated circuit of the microphone of FIG. 2 according to implementations of the present disclosure.

FIG. 11 illustrates a portion of the processing circuit or integrated circuit (IC) 112 of the microphone device 100 according to an implementation of the present disclosure. The IC 112 includes (either in discrete hardware, software, or a combination of both) a reference capacitor 382, an op-amp 386, a low pass filter 394, a band pass filter 398, and an integrator 402. The capacitor 374 is a schematic representation of the capacitance across the portion of conductive pins used to sense pressure changes (e.g., the first conductive pins and the second conductive pins). The capacitor 378 is a schematic representation of the capacitance across the portion of the conductive pins to which the bias signal is applied to control movement of the dielectric grid (e.g., the third conductive pins and the fourth conductive pins). The values of the pressure sensing capacitor 374 and the actuator position sensing capacitor 378 are directly related by the motion of the dielectric grid. The pressure sensing capacitor 374 and the reference capacitor are electrically connected into a half bridge configuration. As illustrated in FIG. 11, the half bridge is driven by opposite phases of a high frequency sine wave 390. In the illustrated embodiment, the sine wave can be between approximately 1 MHz and 3 MHz. The IC 112 is configured to derive a signal $V_m$ that is proportional to a difference between a sensed capacitance $C_S$ of the sensing portion of the dielectric actuator and a capacitance $C_0$ of the reference capacitor 382. The output of the half-bridge is proportional to the following term:

$$V_m = \frac{(C_S - C_0)}{(C_S + C_0)} * \sin(\omega t) \quad (3)$$

Equation 3 is equal to zero when the capacitances $C_S$ and $C_0$ are equal. In the illustrated embodiment, the capacitances are substantially equal when the dielectric grid is in the rest position.

Multiplying Equation 3 by $\sin(\omega t)$ and simplifying the equation yields the following equation:

$$V_d = \frac{C_S - C_0}{2(C_S + C_0)} + \frac{C_S - C_0}{2(C_S + C_0)} * \cos(2\omega t) \quad (4)$$

The demodulated signal $V_d$ can be further processed to yield a bias signal or a signal indicative of a change in the acoustic pressure as described in greater detail below.

The signal $V_d$ can be processed to yield a signal indicative of changes in the atmospheric pressure. The changes in the atmospheric pressure are slow, low frequency changes. The movement of the dielectric grid due to changes in atmospheric pressure causes changes in signal $V_d$ that are below approximately 5 Hz. The signal indicative of the change in the atmospheric pressure can be isolated from the signal $V_d$ by using the low pass filter 394. Low pass filter 394 also filters out the $\cos(2\omega t)$ portion of the signal. The low pass filter 394 allows low frequency signals to pass and filters out high frequency signals. In the illustrated embodiment, the low pass filter 394 is configured to pass signals having frequencies up to approximately 5 Hz and filter out signals having higher frequencies. The portion of the signal that passes through the low pass filter 394, which is indicative of the change in the atmospheric pressure, is then sent to the integrator 402. The signal indicative of the change in atmospheric pressure can be integrated by the integrator 402 to generate a bias signal configured to maintain the values of $C_S$ and $C_0$ substantially equal, thereby maintaining the dielectric grid in the neutral position. The bias signal can command the voltage supply to adjust the voltage supplied to the third conductive pins and the fourth conductive pins slowly enough that the changes in capacitance that occur across the conductive pins as the dielectric grid is repositioned is slow enough not to generate noise in the acoustic signal.

The signal $V_d$ can be further processed to yield a signal indicative of the acoustic pressure. Movement of the dielectric grid due to acoustic activity can be between approximately 50 Hz and approximately 20,000 Hz. The band pass filter 398 is used to isolate the portion of the signal $V_d$ that corresponds to the acoustic signal. In the illustrated embodiment, the band pass filter 398 blocks portions of the signal having frequencies below approximately 50 Hz (the atmospheric pressure signal) and blocks portions of the signal having frequencies above approximately 20,000 Hz including the $\cos(2\omega t)$ which is at several megaHertz, allowing the audio signal to pass to the output.

One implementation relates to a microelectromechanical (MEMS) transducer for a microphone. The MEMS transducer includes a closed chamber, an array of conductive pins, a dielectric grid, and a diaphragm. The closed chamber is at a pressure lower than an atmospheric pressure. The array of conductive pins is in a fixed position in the closed chamber. The array of fixed conductive pins is distributed in two dimensions and has gaps formed therebetween. The dielectric grid is positioned within the closed chamber. The dielectric grid includes a grid of dielectric material positioned between the gaps of the array of fixed conductive pins. The dielectric grid is configured to move parallel to the conductive pins. The diaphragm is configured to form a portion of the closed chamber and deflect in response to changes in a differential pressure between the pressure within the closed chamber and a pressure outside the transducer. The diaphragm is further configured move the dielectric grid relative to the array of fixed conductive pins in response to a change in the differential pressure.

Another implementation relates a microphone including a housing, a microelectromechanical systems (MEMS) transducer, and a processing circuit. The housing has an interior, an exterior, and a port permitting fluid communication between the interior of the housing and the exterior of the housing. The MEMS transducer is positioned within the interior of the housing. At least a portion of the MEMS transducer is in fluid communication with the exterior of the housing through the port. The MEMS transducer includes a closed chamber, an array of conductive pins, a dielectric grid, and a diaphragm. The closed chamber is at a pressure lower than an atmospheric pressure. The array of conductive pins is in a fixed position in the closed chamber. The array of fixed conductive pins is distributed in two dimensions and have gaps formed therebetween. The array of conductive pins includes a first set of conductive pins and a second set of conductive pins. The dielectric grid is positioned within the closed chamber. The dielectric grid includes a grid of dielectric material positioned between the gaps of the array of fixed conductive pins. The dielectric grid is configured to move parallel to the conductive pins. The diaphragm is configured to form a portion of the closed chamber and deflect in response to changes in a differential pressure between the pressure within the closed chamber and a pressure outside the transducer. The diaphragm is further configured to move the dielectric grid relative to the array of fixed conductive pins in response to a change in the differential pressure, thereby changing a capacitance between at least the first set and the second set of the array of conductive pins. The processing circuit is positioned within the housing including a reference capacitor and coupled to the array of conductive pins. The processing circuit is configured to receive signals indicative of the capacitance between at least the first set and the second set of the array of conductive pins and generate an electrical signal indicative of the change in the differential pressure based on the change in capacitance between at least the first set and the second set of the array of conductive pins.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including by not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one recitation, even when the same claim includes the introductory phrases "one or more" or "at least one" and indefinite articles such as "a" or "an" (e.g. "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two functions," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g. "a system having at least one of A, B, or C: would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., means plus or minus ten percent.

The foregoing description of illustrative elements has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A microelectromechanical (MEMS) transducer for a microphone, the MEMS transducer comprising:
    a closed chamber, wherein the closed chamber is at a pressure lower than an atmospheric pressure;
    an array of conductive pins in a fixed position in the closed chamber, the array of fixed conductive pins distributed in two dimensions and having gaps formed therebetween;
    a dielectric grid positioned within the closed chamber, the dielectric grid comprising a grid of dielectric material positioned between the gaps of the array of fixed conductive pins, the dielectric grid configured to move parallel to the array of fixed conductive pins; and
    a diaphragm configured to form a portion of the closed chamber and deflect in response to changes in a differential pressure between the pressure within the closed chamber and a pressure outside the transducer, the diaphragm further configured to move the dielectric grid relative to the array of fixed conductive pins in response to a change in the differential pressure.

2. The MEMS transducer of claim 1, wherein the array of fixed conductive pins comprises a first set of conductive pins that are interconnected to form a first electrode and a second electrode, the capacitance between the first and second electrodes changing in response to movement of the dielectric grid.

3. The MEMS transducer of claim 2, wherein a force parallel to the conductive pins is exerted on the dielectric grid when a voltage source applies a voltage between the at least first and second electrodes.

4. The MEMS transducer of claim 1, wherein the array of fixed conductive pins further comprises a second set of conductive pins that are interconnected to form a third electrode connected to the voltage source and a fourth electrode connected to the voltage source, and a force parallel to the array of fixed conductive pins is exerted on the dielectric grid when a voltage source applies a voltage between the third and fourth electrodes.

5. The MEMS transducer of claim 1, wherein the first electrode comprises a plurality of first electrodes, the second electrode comprises a plurality of second electrodes, the plurality of first electrodes is connected by a plurality of first leads to a first pad and the plurality of second electrodes is connected to a second pad by a plurality of second leads, and wherein the plurality of first leads and the plurality of second leads are interdigitated.

6. The MEMS transducer of claim 1, wherein the dielectric grid is suspended within the closed chamber.

7. The MEMS transducer of claim 6, wherein the dielectric grid is spring-mounted within the closed chamber.

8. The MEMS transducer of claim 1, wherein the closed chamber has a pressure of less than 30 Pa.

9. The MEMS transducer of claim 8, wherein the closed chamber has a pressure of less than 10 Pa.

10. A microphone comprising:
a housing having an interior, an exterior, and a port permitting fluid communication between the interior of the housing and the exterior of the housing;
a microelectromechanical (MEMS) transducer positioned within the interior of the housing, at least a portion of the MEMS transducer in fluid communication with the exterior of the housing through the port, the MEMS transducer comprising:
a closed chamber, wherein the closed chamber is at a pressure lower than an atmospheric pressure;
an array of conductive pins in a fixed position in the closed chamber, the array of fixed conductive pins distributed in two dimensions and having gaps formed therebetween, the array of fixed conductive pins including a first set of conductive pins and a second set of conductive pins;
a dielectric grid positioned within the closed chamber, the dielectric grid comprising a grid of dielectric material positioned between the gaps of the array of fixed conductive pins, the dielectric grid configured to move parallel to the array of fixed conductive pins; and
a diaphragm configured to form a portion of the closed chamber and deflect in response to changes in a differential pressure between the pressure within the closed chamber and a pressure outside the transducer, the diaphragm further configured to move the dielectric grid relative to the array of fixed conductive pins in response to a change in the differential pressure, thereby changing a capacitance between at least the first set and the second set of the array of fixed conductive pins; and
a processing circuit positioned within the housing including a reference capacitor and coupled to the array of fixed conductive pins, the processing circuit configured to receive signals indicative of the capacitance between at least the first set and the second set of the array of fixed conductive pins and generate an electrical signal indicative of the change in the differential pressure based on the change in capacitance between at least the first set and the second set of the array of fixed conductive pins.

11. The microphone of claim 10, wherein the first set of conductive pins are interconnected to form at least one first electrode and at least one second electrode, and wherein the capacitance across the array of fixed conductive pins is a capacitance between at least the first and second electrodes.

12. The microphone of claim 11, wherein the processing circuit is configured to process the electrical signal to generate:
a bias signal indicative of changes in atmospheric pressure, and
an acoustic signal indicative of pressure changes resulting from acoustic activity.

13. The microphone of claim 12, wherein the second set of conductive pins are interconnected to form at least a third electrode and a fourth electrode, and further comprising a voltage source connected to at least the third electrode and the fourth electrode, the voltage source configured to receive the bias signal and to supply a voltage to the at least third electrode and the at least fourth electrode to exert a force parallel to the array of fixed conductive pins on the dielectric grid.

14. The microphone of claim 13, wherein the force is configured to position the dielectric grid so that the capacitance between the at least one first electrode and the at least one second electrode is substantially the same as that of the reference capacitor.

15. The microphone of claim 12, wherein the processing circuit generates the bias signal by filtering the electrical signal with a low pass filter.

16. The microphone of claim 15, wherein the cut-off frequency of the low pass filter is approximately 5 Hz.

17. The microphone of claim 12, wherein the processing circuit generates the acoustic signal by filtering the electrical signal with a band pass filter.

18. The microphone of claim 17, wherein the band pass filter is configured to pass signals having frequencies ranging between approximately 50 Hz and approximately 20,000 Hz.

19. The microphone of claim 10, wherein the dielectric grid is spring-mounted within the closed chamber such that the dielectric grid is suspended within the closed chamber.

20. The microphone of claim 10, wherein the closed chamber has a pressure of less than 30 Pa.

21. The microphone of claim 10, wherein the closed chamber has a pressure of less than 10 Pa.

* * * * *